(12) United States Patent
Badets et al.

(10) Patent No.: US 7,315,214 B2
(45) Date of Patent: Jan. 1, 2008

(54) PHASE LOCKED LOOP

(75) Inventors: Franck Badets, Meylan (FR); Didier Belot, Rives (FR); Vincent Lagareste, Brignoud (FR); Yann Deval, Bordeaux (FR); Pierre Melchior, Andernos (FR); Jean-Baptiste Begueret, Talence (FR)

(73) Assignee: STMicroelectronics S.A., Paris (FR)

( * ) Notice: Subject to any disclaimer, the term of this patent is extended or adjusted under 35 U.S.C. 154(b) by 106 days.

(21) Appl. No.: 11/400,062

(22) Filed: Apr. 7, 2006

(65) Prior Publication Data

US 2006/0232344 A1  Oct. 19, 2006

(30) Foreign Application Priority Data

Apr. 7, 2005 (FR) .................................. 05 03480

(51) Int. Cl.
*H03L 7/00* (2006.01)
*H03L 7/07* (2006.01)
*H03L 7/087* (2006.01)

(52) U.S. Cl. ............................ 331/11; 331/16; 331/17; 331/25; 331/14; 327/157

(58) Field of Classification Search .................. 331/10, 331/11, 14, 16, 17, 18, 25, 34, 175; 327/156, 327/157
See application file for complete search history.

(56) References Cited

U.S. PATENT DOCUMENTS

| | | | |
|---|---|---|---|
| 4,928,075 A | | 5/1990 | Leis |
| 5,142,246 A | * | 8/1992 | Petersson ...................... 331/11 |
| 6,097,777 A | | 8/2000 | Tateishi et al. |
| 6,566,967 B1 | * | 5/2003 | Anumula et al. .............. 331/11 |
| 6,931,243 B2 | * | 8/2005 | Goldman ..................... 455/260 |
| 7,015,763 B1 | * | 3/2006 | Hallivuori et al. ............. 331/11 |

FOREIGN PATENT DOCUMENTS

GB  1 526 928  10/1978

OTHER PUBLICATIONS

FR Search Report for FR 0503480; Oct. 27, 2005.
Herzel, et al. "An Integrated CMOS RF Synthesizer for 802.11a Wireless Lan"; IEEE Journal of Solid State Circuits; Oct. 2003; pp. 1767-1770; vol 38, No. 10.

* cited by examiner

*Primary Examiner*—Robert Pascal
*Assistant Examiner*—Ryan J Johnson
(74) *Attorney, Agent, or Firm*—Hogan & Hartson LLP

(57) ABSTRACT

A phase locked loop includes a controlled oscillator for delivering an output signal at a determined output frequency, and a variable frequency divider for converting the output signal into a signal at divided frequency. The PLL is termed composite in that it includes at least one first loop having a loop filter for generating a first control signal for the oscillator on the basis of the signal at divided frequency, and a second loop having a loop filter, different from the loop filter of the first loop, for generating, on the basis of the signal at divided frequency, a second signal for additional control of the oscillator. The loop filter of the first loop and the loop filter of the second loop have different respective cutoff frequencies. The passband of the first loop, can be adapted to ensure the convergence and the stability of the PLL, while the second loop can afford extra passband increasing the speed of adaptation of the PLL in case of modification of the value of a preset for the output frequency.

24 Claims, 3 Drawing Sheets

PHASE LOCKED LOOP

RELATED APPLICATION

The present application claims priority of French Patent Application No. 05 03480 filed Apr. 7, 2005, which is incorporated herein in its entirety by this reference.

FIELD OF THE INVENTION

The present invention relates to phase locked loops (PLLs). It finds applications, in particular, in frequency synthesizers used, for example, in radiofrequency (RF) transmitters and/or receivers.

BACKGROUND OF THE INVENTION

A PLL conventionally comprises a voltage controlled oscillator (VCO) delivering a signal at high frequency, a frequency divider (also called loop divider) converting the signal at high frequency into a signal at divided frequency, a phase comparator producing a measurement signal for measuring a phase deviation between the signal at divided frequency and a reference signal at a reference frequency, and a low-pass filter (also called loop filter) to which is applied the measurement signal and whose output controls the VCO.

In the application to frequency synthesis, the value of the division factor applied by the frequency divider is adapted so as to obtain a preset value for the frequency of the output signal of the VCO. Specifically, we have the following relation:

$$Fout = N \times Fref \quad (1)$$

where Fout is the frequency of the output signal of the VCO;

where Fref is the reference frequency of the PLL; and, where N is the (integer) division support of the loop divider.

The passband of the PLL corresponds to that of a low-pass filter. It determines the speed of the response to a modification of the preset. It is a significant element in the performance of the synthesizer incorporating this PLL. Specifically, the larger the passband of the PLL, the faster the stabilization of the synthesized frequency, upon a change of radio channel, for example.

Moreover, the passband dictates the monitoring of the phase noise of the source of the reference signal (which is often better than the phase noise of the VCO at low frequencies) in this frequency band. Consequently, the larger the passband, the weaker the phase noise of the PLL, and hence of the synthesizer, at low frequencies.

This is why it is desirable to widen the passband of the PLL, so as to optimize the speed and reduce the phase noise of the frequency synthesizer incorporating it.

The passband of the PLL is essentially determined by the passband of the loop filter and by the open-loop gain of the PLL. Now, the passband of the loop filter is chosen so as to filter the spurious line generated by the phase comparator at the reference frequency.

To ensure the stability of the loop, it is advisable to take for the loop filter a passband equal to or less than $$\frac{Fref}{10},$$

or even $$\frac{Fref}{15}.$$

Compliance with this criterion ensures good stability and good rejection of the spurious line at Fref generated by the phase comparator.

The passband of the PLL therefore depends directly on the reference frequency Fref of the PLL. The higher the frequency Fref, the wider this passband. But the reference frequency also defines the synthesis interval, that is to say, for example, the frequency gap separating two adjacent radio channels (for example, 200 kHz for GSM). The passband of the PLL therefore depends on the reference frequency, which itself depends on the standards envisaged (by way of the synthesis interval).

In the prior art, a solution for increasing Fref without impairing the synthesis interval has already been proposed. This is the fractional (i.e. noninteger) PLL.

The fractional PLL has established itself as a compromise, by replacing the integer division ratio frequency divider with a fractional frequency divider (noninteger division). It is thus possible to increase the reference frequency (for example from 200 kHz to 10 MHz) while retaining the same synthesis interval (200 kHz in the example).

A fractional PLL uses a fractional loop divider, based on the use of a Sigma-Delta modulator whose output drives the control input for the division ratio of the divider. Such a fractional divider divides by N during a determined number P−1 of cycles of the reference signal and by N+1 during a cycle of the reference signal. We thus obtain, on average, the following relation:

$$Fout = Fref \times \left(N + \frac{1}{P}\right) \quad (2)$$

The synthesis interval becomes less than the reference frequency, since it is equal to about $$Fref \times \left(\frac{1}{P^2}\right).$$

For a identical synthesis interval, it is thus possible to use a higher reference frequency, thereby also making it possible to increase the passband of the PLL.

This frequency is however obtained solely as an average, over N periods of the reference signal, this having the direct consequence of causing spurious lines to appear at output. These spurious lines limit the utilizable passband of the fractional PLL. Admittedly, the Sigma-Delta modulator shapes the noise in the high frequencies, but we are nevertheless compelled to lower the cutoff frequency of the loop filter to filter it.

For this reason, the fractional PLL is not entirely satisfactory from the point of view of the problem posed.

SUMMARY OF THE INVENTION

This is why it is proposed to increase the passband of the loop filter of the PLL while conserving the same rejection of the spurious line generated by the phase comparator at the reference frequency.

The invention thus proposes a phase locked loop (PLL), comprising a controlled oscillator (for example a VCO) for delivering an output signal at a determined output frequency, and a frequency divider (for example a variable frequency divider) for converting the output signal into a signal at divided frequency. The PLL comprises at least one first loop having a loop filter for generating a first signal for controlling the oscillator on the basis of the signal at divided frequency, and a second loop having a loop filter, different from the loop filter of the said first loop, for generating, on the basis of the signal at divided frequency, a second signal for additional control of the oscillator. The loop filter of the said first loop and the loop filter of the said second loop have different respective cutoff frequencies.

It will be noted that the two loops can be active simultaneously, each affording a contribution to the filtering of the phase noise of the controlled oscillator. Specifically, the effects of the first and of the second control signal for the VCO are aggregated. It is in this sense that the second control signal is termed the additional control signal.

Such a PLL is called a composite PLL. The passband of the first loop, or main loop, can be adapted to ensure the convergence and the stability of the PLL, while the second loop, or secondary loop, can afford extra passband. Of course, the invention is not limited by the number of loops, which can be greater than two.

In a first embodiment, the first and the second loops have in common a phase/frequency comparator, making it possible to produce at least one first and one second signal for measuring a phase and frequency deviation between the signal at divided frequency, on the one hand, and a reference signal at a determined reference frequency, on the other hand.

Advantageously, the phase comparator comprises a single phase/frequency detector (PFD) followed, on the one hand, by a first charge pump producing the first measurement signal, and, on the other hand, by a second charge pump producing the second measurement signal. By separating the charge pumps it is possible in particular to have independent monitoring of the open-loop gain for each loop, and this simplifies the design of the VCO.

In a second embodiment, the first loop comprises a phase/frequency comparator followed by a charge pump producing the first measurement signal. The second loop comprises a frequency detector producing a second measurement signal.

Preferably, for the first and the second embodiment above, the loop filter of the first loop is a low-pass filter which has a cutoff frequency lower than the reference frequency, and the loop filter of the second loop is a bandpass filter which is centred between the cutoff frequency of the loop filter of the first loop, on the one hand, and the reference frequency, on the other hand, and which has a low cutoff frequency higher than the cutoff frequency of the loop filter of the first loop and a high cutoff frequency lower than the reference frequency. Thus, the stability of the PLL is ensured by the first loop, and the passband of the PLL is increased by virtue of the second loop while ensuring the rejection of the reference frequency.

In a third embodiment, the first loop comprises a first phase comparator for producing a first signal of measurement of a phase deviation between the signal at divided frequency, on the one hand, and a first reference signal at a first determined reference frequency, on the other hand; and the second loop comprises a second phase comparator for producing a second signal of measurement of a phase deviation between a signal obtained by frequency multiplication on the basis of the signal at divided frequency, on the one hand, and a first reference signal at a second determined reference frequency, different from, and higher than, the first reference frequency, on the other hand. This embodiment makes it possible to operate the second loop at a frequency higher than the reference frequency of the first loop. It is thus possible to correct variations of phase of the output signal that are higher than this frequency.

In a fourth embodiment, the first loop is identical to that of the third embodiment and the second loop comprises a frequency comparator for producing a second signal of measurement of a frequency deviation between a signal on the basis of the signal at divided frequency, on the one hand, and a first reference signal at a second determined reference frequency, different from, and in particular higher than, the first reference frequency, on the other hand. It is thus possible to correct variations of frequency of the output signal that are higher than the first reference frequency.

Preferably, for the third and the fourth embodiments above, the loop filter of the first loop is a low-pass filter whose cutoff frequency is lower than the first reference frequency, and the loop filter of the second loop is a bandpass filter centred between the first reference frequency, on the one hand, and the second reference frequency, on the other hand, and which has a low cutoff frequency higher than the first reference frequency and a high cutoff frequency lower than the second reference frequency. We thus ensure the rejection of each of the reference frequencies of the first and of the second loop.

Advantageously, the PLL can comprise in addition a frequency multiplier multiplying by M having an input receiving the signal at divided frequency and an output coupled to the input of the second phase comparator, where M is the ratio of the frequency of the second reference signal to the frequency of the first reference signal. Only one frequency divider (the loop divider) is then required and, above all, the signals obtained on the basis of the output signal which are provided at the input of the phase comparators, and of the frequency comparator for the fourth embodiment, are synchronous.

It is also possible to make provision for means, such as a controlled breaker, for temporarily deactivating the second loop, for example on power-up and/or in case of change of the value of a preset for the output frequency. This makes it possible to ensure the stability of the PLL before bringing the second loop into service, the effect of which may frustrate that of the first loop.

Another aspect of the invention proposes a frequency synthesizer comprising a phase and frequency locked loop according to one of the embodiments described above.

BRIEF DESCRIPTION OF THE DRAWINGS

Other characteristics and advantages of the invention will become further apparent on reading the description which follows. The latter is purely illustrative and should be read in conjunction with the drawings in which.

Unless mentioned otherwise, in the drawings, identical or similar elements bear identical references across all the figures.

DETAILED DESCRIPTION

Figure 1:
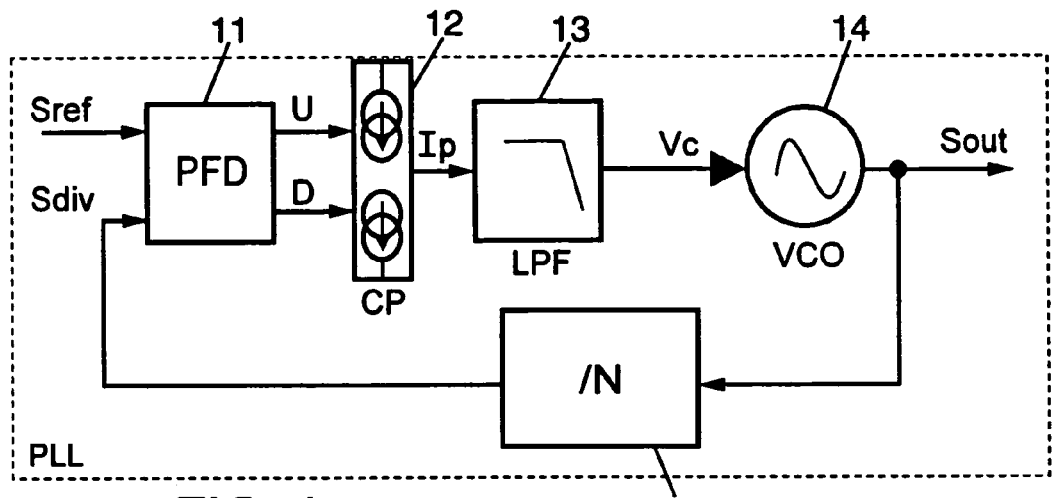
FIG. 1 is a diagram of a PLL according to the prior art.

With reference to FIG. 1, a PLL used in a frequency synthesizer according to the prior art comprises a VCO 14 delivering a radiofrequency signal Sout, whose frequency Fout is for example of the order of a few hundred MHz. This signal is addressed to a frequency divider 15 applying a variable division ratio N. By modifying N, we change the frequency of the output signal Sout.

The division ratio of the frequency divider can be a determined integer, that is to say the PLL can be a integer PLL. As a variant, it may be a fractional PLL, of the type described in the introduction.

In the example considered, the PLL is a charge pump PLL (CP-PLL), which is one of the most used PLL structures. In such a PLL, a phase comparator comprises a phase/frequency detector (PFD) delivering two binary digital signals, followed by a charge pump (CP) ensuring the conversion of these signals into an analog signal which facilitates the realization of the loop filters.

Here, the signal Sdiv at divided frequency which arises from the frequency divider 15, is addressed to an input of a PFD 11 which receives in addition a reference signal Sref produced on the basis of a crystal oscillator. The frequency Fref of the signal Sref is for example of the order of some ten MHz. To obtain a determined frequency Fvco at the output of the VCO 14, we take N=Fout/Fref.

The PFD 11 delivers at output two binary digital signals, U and D. A charge pump 12 (CP) receives these two signals so as to establish a charging current Ip at an input node of a low-pass filter 13 (LPF) having a cutoff frequency Fc1. The current Ip constitutes a signal for measuring the phase/frequency deviation between the signals Sdiv and Sref. The filtered voltage Vc produced by the filter 13 on the basis of the current IP is used to control the frequency of the VCO 14.

Figure 2:
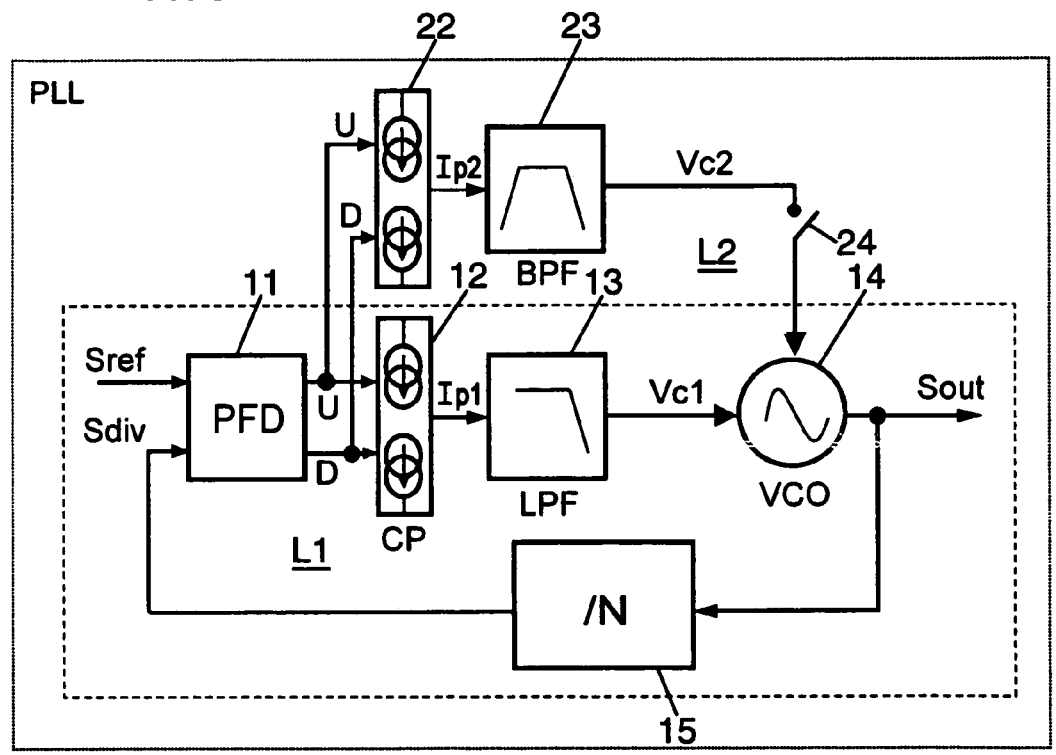
FIG. 2 is a diagram of a first exemplary embodiment of a composite PLL according to the first aspect of the invention.

The diagram of FIG. 2 illustrates a first exemplary embodiment of a composite PLL.

In this first exemplary embodiment, the PLL comprises a first loop L1, or main loop, which corresponds to the PLL of FIG. 1 (and is represented inside the dashed frame). The detection signal generated by the charge pump 12, is here denoted Ip1. Likewise, the control signal for the VCO delivered by the low-pass filter 13 is here denoted Vc1.

The PLL of FIG. 2 furthermore includes a second loop L2 for secondary loop. This is why the VCO 14 comprises two control inputs, which are for example respectively coupled to variable capacitors (not represented) internal to the VCO, for receiving control signals respectively associated with each of the two loops. The respective effects of these two control signals on the phase/frequency of the output signal Sout are cumulative.

In addition to the VCO 14, the frequency divider 15 and the PFD 11, the loop L2 here comprises another charge pump 22, which receives at input the binary digital signals U and D delivered by the PFD 11, and delivers at output a detection signal Ip2. The loop L2 also comprises another filter 23, which is preferably a bandpass filter (BPF), having a low cutoff frequency Fc21 and a high cutoff frequency Fc22. This filter receives the detection signal Ip2 at input. The filtered voltage Vc2 produced by this filter 23 on the basis of the signal Ip2 is used, in combination with the voltage Vc1 produced by the filter 13, in the guise of control signal for controlling the frequency of oscillation of the VCO 14.

By providing two different charge pumps, one for each loop, while just a single PFD is used, it is possible to monitor the open-loop gain of each loop independently of the other. Specifically, if there were only a single charge pump, on the one hand its output current would be shared between the two filters 13 and 23 in inverse proportion to their respective input impedance, which is poorly controlled, and on the other hand the only way to monitor the open-loop gain of each loop would be to monitor the voltage/frequency conversion gains respectively associated with the two control inputs of the VCO 14. This would make the stability more difficult to monitor since there would be one less degree of freedom.

Denoting these gains Kvco1 and Kvco2, the frequency Fout of the signal Sout at the output of the VCO 14 is given by the following relation:

$$Fvco = Kvco1 \times Vc1 + Kvco2 \times Vc2 \qquad (3)$$

In the example considered here, the speed of convergence and the stability of the PLL are determined mainly by the main loop L1. On the other hand, the secondary loop makes it possible to reduce the phase noise at the output of the PLL with respect to a PLL of the prior art. By judiciously choosing the coefficients Kvco1 and Kvco2, it is possible to give more or less weight to one of the two loops relative to the other. Preferably, care is taken not to give more weight to the secondary loop than to the main loop, so as not to risk destabilizing the PLL.

On power-up, and also with each modification of the value of a preset for the frequency Fout, the two loops L1 and L2 may come into conflict when the effect of one frustrates the effect of the other. The main loop L1 having the role of ensuring the convergence and the stability of the PLL, the secondary loop L2 can advantageously be activated only after the locking of the main loop L1.

For this purpose, a numerically controlled breaker 24, or any similar means, can be placed in the secondary loop L2 to temporarily deactivate the loop L2, for example on power-up and/or after each change of the value of a preset for the output frequency Fout (for example for a change of radio channel) corresponding to a change of the value of N. When the breaker 24 is closed, the two loops L1 and L2 operate simultaneously, and their respective effects on the filtering of the phase noise of the VCO 14 are added together.

Figure 3:
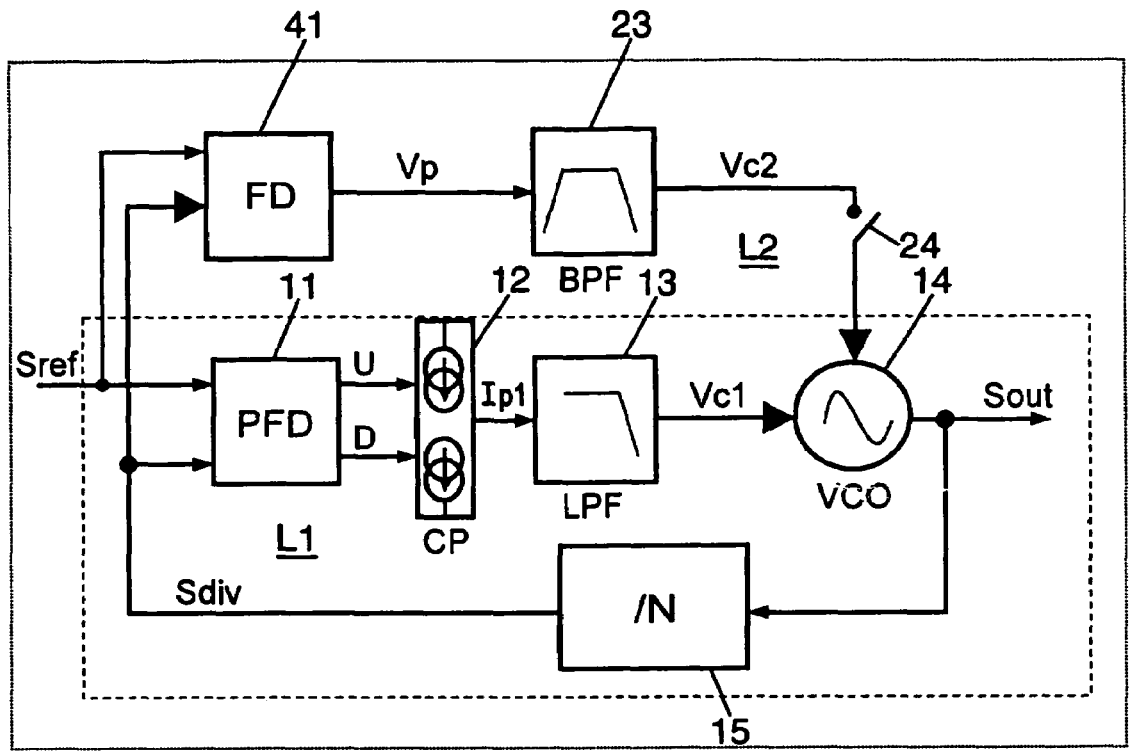
FIG. 3 is a diagram of a second embodiment of a composite PLL according to the first aspect of the invention.

With reference to FIG. 3, it is possible to replace the phase/frequency comparator of the loop L2 (which comprises the PFD 11 and the charge pump 22), with a frequency detector 41. This difference entails a completely different behavior for the PLL. A phase detector gives an error when the two compared signals are not in phase. More particularly, it generates a error signal such as to be proportional to the phase error between the two signals. A frequency detector does not generate any error signal at output in this case. Conversely, when the two signals to be compared are in phase but of different frequency, the frequency detector generates a error signal at output. In the two cases above, a phase/frequency detector, such as the PFD 11, generates a error signal at output.

If we consider that the main loop (loop L1, for example at low frequency) is locked, this implies that the phase/frequency variations are small. These variations can be interpreted in two ways: as phase variations or as frequency variations. Stated otherwise, it is possible to see the noise on the signal at divided frequency Sdiv as frequency-like noise by assuming that the main loop L1 slaves the phase/frequency of the output signal Sout to the reference signal Sref by way of the phase/frequency detector 11. This is why the embodiment of FIG. 3 is proposed.

This embodiment is identical to that of FIG. 2 except in that, for the secondary loop L2, the frequency detector 41 receives the signal at divided frequency Sdiv on a first input, receives the reference signal Sref on a second input delivers at output a signal for measuring the phase/frequency deviation Vp. The filter 23 generates the second control signal Vc2 at output, on the basis of this signal Vp received at input.

Using a frequency detector in the loop L2 facilitates the design of the PLL. Specifically, as there is a relation of integration (with respect to time) between the phase and the frequency, there is no longer any need to model the VCO as an integrator (no need for frequency/phase conversion). It is possible to model it as a simple gain (in Hz/V). Hence no additional gain need be provided in the loop L2 to compensate for the attenuation introduced by this integrator.

Figure 4:
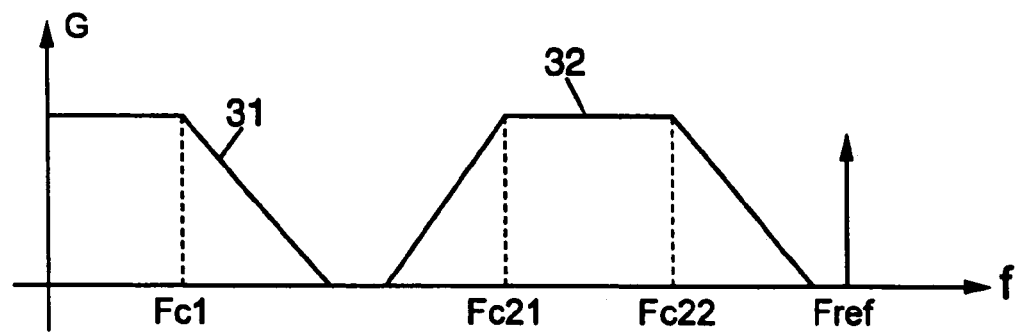
FIG. 4 gives the graph of the frequency response (gain as a function of frequency) of the composite PLL of FIG. 2 or of the PLL of FIG. 3.

In FIG. 4 is represented an example of a graph of the frequency response (gain as a function of frequency) of the composite PLL of FIG. 2 or of FIG. 3. On this graph, it is possible to distinguish the contribution to the filtering afforded by the loop L1, which corresponds to the template 31 of a low-pass filter, from the contribution to the filtering afforded by the loop L2, which corresponds to the template 32 of a bandpass filter.

The template 31 is essentially determined by the passband of the loop filter 13 of the loop L1, while the template 32 is essentially determined by the passband of the loop filter 23 of the loop L2.

More particularly, the loop filter 13 of the loop L1, which is a low-pass filter, has a cutoff frequency Fc1 lower than the reference frequency Fref. The loop filter 23 of the loop L2, which is a bandpass filter, is centred between the cutoff frequency Fc1 of the loop filter 13 of the loop L1, on the one hand, and the reference frequency Fref of the PLL, on the other hand. For example, it has a low cutoff frequency Fc21 higher than the cutoff frequency Fc1 of the loop filter 13 of the loop L1 and a high cutoff frequency Fc22 lower than the reference frequency Fref.

Typically, we will choose Fc1 in such a way that the loop L1 ensures the stability of the PLL, for example with Fc1 lower than $$\frac{Fref}{100},$$

depending on the application. Moreover, we will choose Fc22 such that the loop L2 ensures good rejection of the frequency Fref, for example with Fc22 lower than $$\frac{Fref}{10},$$

or even lower than $$\frac{Fref}{15}.$$

Thus, the frequency response of the loop L2 makes it possible to increase the passband of the composite PLL without threatening its stability, and while maintaining good rejection of the spurious line at the frequency Fref.

The secondary loop L2 has the effect of taking into account the phase variations at high frequencies (with respect to the main loop L1). Stated otherwise, the phase errors at high frequencies which have not been taken into account by the main loop L1 are corrected by the secondary loop L2.

However, it will be noted that the frequencies of phase variation compensatable by the secondary loop L2 are dependent on the reference frequency Fref. Specifically, the VCO 14 phase information observed through the frequency divider 15 is refreshed only at the reference frequency Fref (there is a new comparison at each cycle of the reference signal Fref). Consequently, only phase variation frequencies that are lower than the reference frequency Fref divided by two can be corrected.

The secondary loop L2 of the composite PLLs according to FIGS. 2 and 4 are all the more beneficial if the main loop L1 has a small passband [0-Fc1] and a high reference frequency Fref. This case of interest may be encountered, for example, for frequency synthesis with a frequency translation loop where this architecture is particularly suited.

But this is not the case for all the frequency syntheses. This is the reason why two architectures of composite PLLs are also proposed, as alternatives to those which were presented above in conjunction with the diagrams of FIG. 2 and of FIG. 3, respectively.

Figure 5:
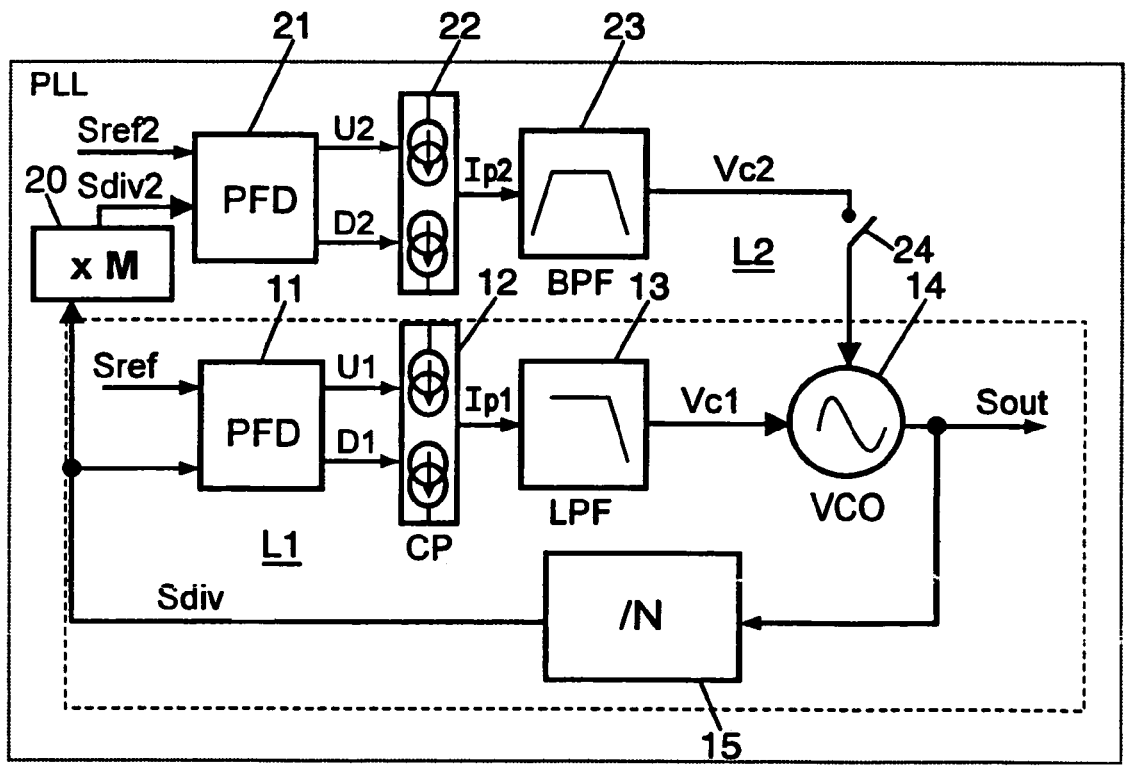
FIG. 5 is a diagram of a third embodiment of a composite PLL according to the first aspect of the invention.

A third embodiment of the composite PLL is thus illustrated by the diagram of FIG. 5. It is distinguished from that of FIG. 2 by the presence of a phase/frequency comparator for each of the loops L1 and L2. Stated otherwise, instead of having a phase comparator common to the two loops, as in the case of FIG. 2, the composite PLL here has a phase/frequency comparator for each loop, each operating at its own reference frequency Fref and Fref2 respectively. In particular, the reference frequency Fref2 of the loop L2 is higher than the reference frequency Fref of the loop L1.

In an example, Fref2 is M times larger than Fref, where M is a determined integer. Advantageously, reference signals Sref and Sref2 at the reference frequencies Fref and Fref2 respectively, are obtained by frequency division of the oscillation signal of one and the same crystal oscillator, the signal Sref being obtained on the basis of the signal of Sref2 via an additional frequency divider by M.

Also, the composite PLL of FIG. 5 comprises a frequency multiplier multiplying by M, referenced 20, for example in the secondary loop L2, for producing a signal Sdiv2 on the basis of the signal Sdiv.

The phase/frequency comparator of the loop L1 comprises the PFD 11, receiving the signal Sdiv (generated by the frequency divider 15 on the basis of the output signal Sout) and the signal Sref at input, and delivering at the output binary digital signals here denoted U1 and D1. The PFD 11 is followed by the charge pump 12, which delivers the analog detection signal Ip1 on the basis of the signals U1 and D1.

The phase/frequency comparator of the loop L2 comprises another PFD 21, receiving a signal Sdiv2 (generated by the frequency multiplier 20 on the basis of the signal Sdiv) and the signal Sref2 at input, and delivering at the output binary digital signals here denoted U2 and D2. The PFD 21 is followed by the charge pump 22, which delivers the analog detection signal Ip2 on the basis of the signals U2 and D2.

Figure 6:
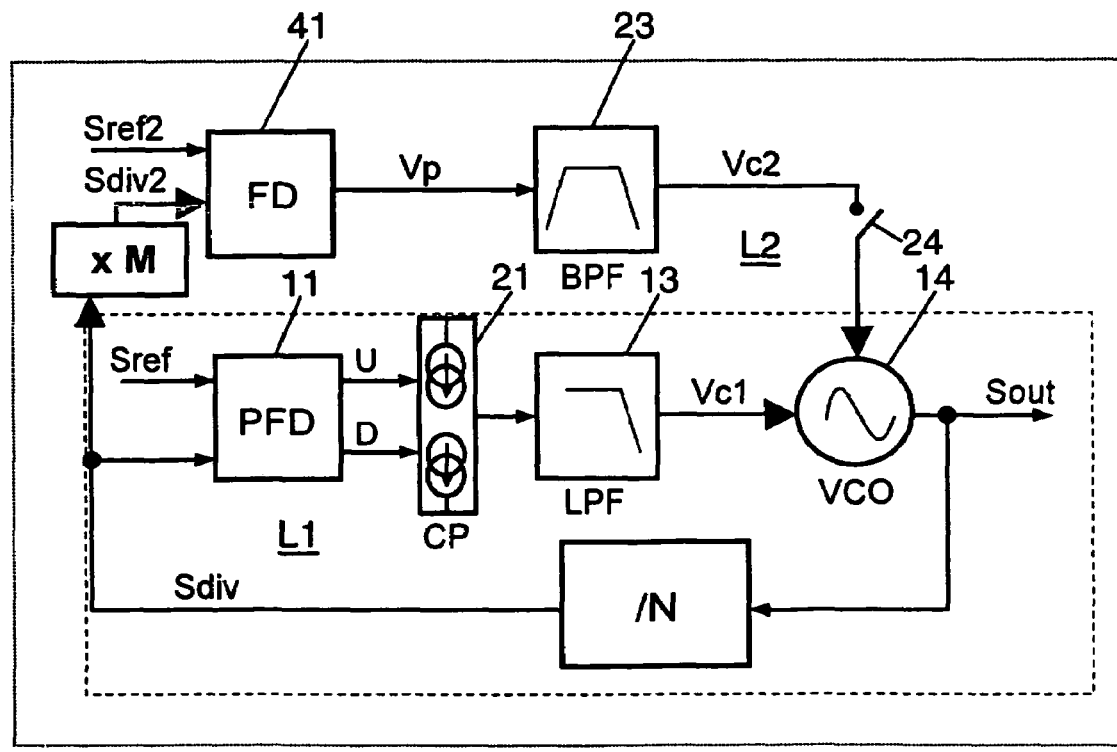
FIG. 6 is a diagram of a fourth embodiment of a composite PLL according to the first aspect of the invention.

A fourth embodiment, illustrated by the diagram of FIG. 6, is a combination of the second and third embodiments, previously described with reference to FIGS. 3 and 5, respectively.

Figure 7:
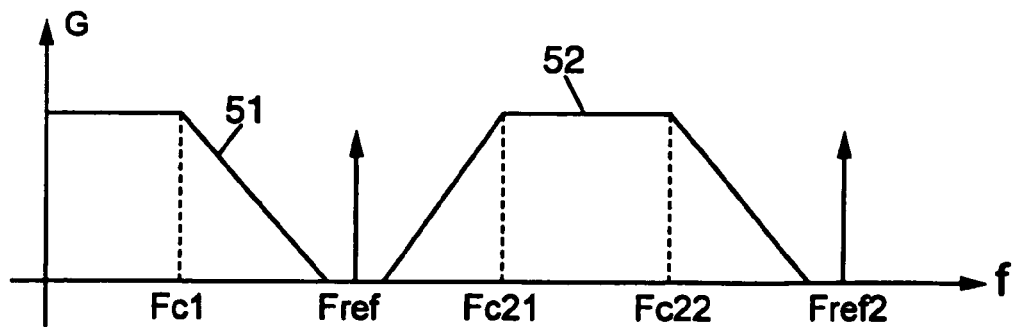
FIG. 7 gives the graph of the frequency response (gain as a function of frequency) of the composite PLL of FIG. 5.

In FIG. 7 is represented an example of a graph of the frequency response of the composite PLL of FIG. 5 or of FIG. 6. On this graph, it is possible to distinguish the contribution to the filtering afforded by the loop L1, which corresponds to the template 51 of a low-pass filter, from the contribution to the filtering afforded by the loop L2, which corresponds to the template 52 of a bandpass filter.

With the same notation as that used earlier with reference to FIG. 4, the loop filter 13 of the loop L1, which is a low-pass filter, has a cutoff frequency Fc1 lower than the reference frequency Fref. The loop filter 23 of the loop L2, which is a bandpass filter, is centred between the reference frequency Fref of the loop L1, on the one hand, and the reference frequency Fref2 of the loop L2, on the other hand. For example, its low cutoff frequency Fc21 is higher than the frequency Fref and its high cutoff frequency Fc22 is lower than the frequency Fref2.

Typically, we will again choose Fc1 in such a way that the loop L1 ensures the stability of the PLL, for example with Fc1 less than $$\frac{Fref}{10}$$

or even less than $$\frac{Fref}{15},$$

depending on the application. Moreover, we will choose Fc21 and Fc22 such that the loop L2 ensures good rejection of the frequencies Fref and Fref2, for example with Fc21 greater than 10×Fref or even greater than 15×Fref, and with Fc22 less than $$\frac{Fref2}{10},$$

or even less than $$\frac{Fref2}{15}.$$

Thus, the frequency response of the loop L2 here again makes it possible to increase the passband of the composite PLL without threatening its stability, and while maintaining good rejection of the spurious lines at the frequency Fref1 and at the frequency Fref2.

The third and the fourth embodiments described above allow the secondary loop L2 to operate at a reference frequency Fref2 higher than that of the main loop L1, and thus allow an increase in the correctable frequencies of phase variation of the output signal Sout.

These third and fourth embodiments hence have the main advantage of alleviating the aforesaid drawbacks of the architecture corresponding to the first and to the second embodiments, but at the price of increased complexity.

Figure 8:
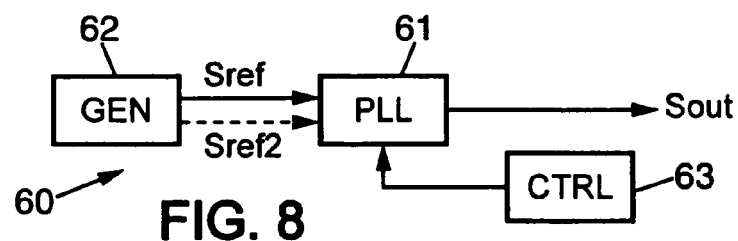
FIG. 8 is a diagram of a frequency synthesizer according to the second aspect of the invention.

Another aspect of the invention, illustrated by the diagram of FIG. 8, relates to a frequency synthesizer 60 comprising a composite PLL 61 according to one of the embodiments described above, for generating an output signal Sout.

In a manner known per se, such a synthesizer comprises a clocks generator 61 having an oscillator, such as a crystal oscillator, as well as a (or several) frequency divider(s) for generating the reference signal (or signals) Sref and Sref2.

It also comprises a unit 63 for controlling the division factor N of the divider of the PLL, according to the requirements of the application.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A phase locked loop comprising:
   a controlled oscillator for delivering an output signal at a determined output frequency; and
   a frequency divider for converting the output signal into a signal at divided frequency, including:
   a first loop having a loop filter for generating a first signal for control of the oscillator on the basis of the signal at divided frequency, wherein the first loop comprises a first phase/frequency comparator for producing a first signal of measurement of a phase/ frequency deviation between the signal at divided frequency, on the one hand, and a first reference signal at a first determined reference frequency, on the other hand; and a second loop having a loop filter different from the loop filter of the first loop, for generating, on the basis of the signal at divided frequency, a second signal for additional control of the oscillator, wherein the second loop comprises a second phase/frequency comparator for producing a second signal of measurement of a phase/frequency deviation between a signal obtained by frequency multiplication on the basis of the signal at divided frequency, on the one hand, and a second reference signal at a second determined reference frequency, higher than the said first reference frequency, on the other hand, wherein the loop filter of the said first loop and the loop filter of the said second loop have different respective cutoff frequencies.

2. A phase locked loop according to claim 1, wherein the loop filter of the first loop is a low-pass filter whose cutoff frequency is lower than the first reference frequency, and wherein the loop filter of the second loop is a bandpass filter centered between the first reference frequency, on the one hand, and the second reference frequency, on the other hand, and which has a low cutoff frequency higher than the first reference frequency and a high cutoff frequency lower than the second reference frequency.

3. A phase locked loop according to claim 1, comprising a frequency multiplier multiplying by M having an input receiving the signal at divided frequency and an output coupled to the input of the second phase/frequency comparator, where M is the ratio of the frequency of the second reference signal to the frequency of the first reference signal.

4. A phase locked loop according to claim 1, comprising means for temporarily deactivating the second loop on power-up and/or in case of change of a preset for the output frequency.

5. A phase locked loop comprising:
a controlled oscillator for delivering an output signal at a determined output frequency; and
a frequency divider for converting the output signal into a signal at divided frequency, including:
a first loop having a loop filter for generating a first signal for control of the oscillator on the basis of the signal at divided frequency, wherein the first loop comprises a phase/frequency comparator for producing a first signal of measurement of a phase/frequency deviation between the signal at divided frequency, on the one hand, and a first reference signal at a first determined reference frequency, on the other hand; and
a second loop having a loop filter different from the loop filter of the first loop, for generating, on the basis of the signal at divided frequency, a second signal for additional control of the oscillator, wherein the second loop comprises a frequency detector for producing a second signal of measurement of a frequency deviation between a signal obtained by frequency multiplication on the basis of the signal at divided frequency, on the one hand, and a second reference signal at a second determined reference frequency, higher than the said first reference frequency, on the other hand, wherein the loop filter of the said first loop and the loop filter of the said second loop have different respective cutoff frequencies.

6. A phase locked loop according to claim 5, wherein the loop filter of the first loop is a low-pass filter whose cutoff frequency is lower than the first reference frequency, and wherein the loop filter of the second loop is a bandpass filter centred between the first reference frequency, on the one hand, and the second reference frequency, on the other hand, and which has a low cutoff frequency higher than the first reference frequency and a high cutoff frequency lower than the second reference frequency.

7. A phase locked loop according to claim 5, comprising a frequency multiplier multiplying by M having an input receiving the signal at divided frequency and an output coupled to the input of the frequency detector, where M is the ratio of the frequency of the second reference signal to the frequency of the first reference signal.

8. A phase locked loop according to claim 5, comprising means for temporarily deactivating the second loop on power-up and/or in case of change of a preset for the output frequency.

9. A frequency synthesizer comprising:
a phase locked loop including:
a controlled oscillator for delivering an output signal at a determined output frequency; and
a frequency divider for converting the output signal into a signal at divided frequency, including:
a first loop having a loop filter for generating a first signal for control of the oscillator on the basis of the signal at divided frequency, wherein the first loop comprises a first phase/frequency comparator for producing a first signal of measurement of a phase/frequency deviation between the signal at divided frequency, on the one hand, and a first reference signal at a first determined reference frequency, on the other hand; and
a second loop having a loop filter different from the loop filter of the said first loop, for generating, on the basis of the signal at divided frequency, a second signal for additional control of the oscillator, wherein the second loop comprises a second phase/frequency comparator for producing a second signal of measurement of a phase/frequency deviation between a signal obtained by frequency multiplication on the basis of the signal at divided frequency, on the one hand, and a second reference signal at a second determined reference frequency, higher than the said first reference frequency, on the other hand, wherein the loop filter of the said first loop and the loop filter of the said second loop have different respective cutoff frequencies.

10. A frequency synthesizer according to claim 9, wherein the loop filter of the first loop is a low-pass filter whose cutoff frequency is lower than the first reference frequency, and wherein the loop filter of the second loop is a bandpass filter centred between the first reference frequency, on the one hand, and the second reference frequency, on the other hand, and which has a low cutoff frequency higher than the first reference frequency and a high cutoff frequency lower than the second reference frequency.

11. A frequency synthesizer according to claim 9, comprising a frequency multiplier multiplying by M having an input receiving the signal at divided frequency and an output coupled to the input of the second phase/frequency comparator, where M is the ratio of the frequency of the second reference signal to the frequency of the first reference signal.

12. A frequency synthesizer according to claim 9, comprising means for temporarily deactivating the second loop on power-up and/or in case of change of a preset for the output frequency.

13. A frequency synthesizer comprising:
a phase locked loop including:
a controlled oscillator for delivering an output signal at a determined output frequency; and
a frequency divider for converting the output signal into a signal at divided frequency, including:
a first loop having a loop filter for generating a first signal for control of the oscillator on the basis of the signal at divided frequency, wherein the first loop comprises a phase/frequency comparator for producing a first signal of measurement of a phase/frequency deviation between the signal at divided frequency, on the one hand, and a first reference signal at a first determined reference frequency, on the other hand; and
a second loop having a loop filter different from the loop filter of the said first loop, for generating, on the basis of the signal at divided frequency, a second signal for additional control of the oscillator, wherein the second loop comprises a frequency detector for producing a second signal of measurement of a frequency deviation between a signal obtained by frequency multiplication on the basis of the signal at divided frequency, on the one hand, and a second reference signal at a second determined reference frequency, higher than the said first reference frequency, on the other hand,
wherein the loop filter of the said first loop and the loop filter of the said second loop have different respective cutoff frequencies.

14. A frequency synthesizer according to claim 13, wherein the loop filter of the first loop is a low-pass filter whose cutoff frequency is lower than the first reference frequency, and wherein the loop filter of the second loop is a bandpass filter centred between the first reference frequency, on the one hand, and the second reference frequency, on the other hand, and which has a low cutoff frequency higher than the first reference frequency and a high cutoff frequency lower than the second reference frequency.

15. A frequency synthesizer according to claim 13, comprising a frequency multiplier multiplying by M having an input receiving the signal at divided frequency and an output coupled to the input of the frequency detector, where M is the ratio of the frequency of the second reference signal to the frequency of the first reference signal.

16. A frequency synthesizer according to claim 13, comprising means for temporarily deactivating the second loop on power-up and/or in case of change of a preset for the output frequency.

17. A radiofrequency transmitter and/or receiver comprising:
a frequency synthesizer including:
a phase locked loop including:
a controlled oscillator for delivering an output signal at a determined output frequency; and
a frequency divider for converting the output signal into a signal at divided frequency, including:
a first loop having a loop filter for generating a first signal for control of the oscillator on the basis of the signal at divided frequency, wherein the first loop comprises a first phase/frequency comparator for producing a first signal of measurement of a phase/frequency deviation between the signal at divided frequency, on the one hand, and a first reference signal at a first determined reference frequency, on the other hand; and
a second loop having a loop filter different from the loop filter of the said first loop, for generating, on the basis of the signal at divided frequency, a second signal for additional control of the oscillator, wherein the second loop comprises a second phase/frequency comparator for producing a second signal of measurement of a phase/frequency deviation between a signal obtained by frequency multiplication on the basis of the signal at divided frequency, on the one hand, and a second reference signal at a second determined reference frequency, higher than the said first reference frequency, on the other hand,
wherein the loop filter of the said first loop and the loop filter of the said second loop have different respective cutoff frequencies.

18. A radiofrequency transmitter and/or receiver according to claim 17, wherein the loop filter of the first loop is a low-pass filter whose cutoff frequency is lower than the first reference frequency, and wherein the loop filter of the second loop is a bandpass filter centered between the first reference frequency, on the one hand, and the second reference frequency, on the other hand, and which has a low cutoff frequency higher than the first reference frequency and a high cutoff frequency lower than the second reference frequency.

19. A radiofrequency transmitter and/or receiver according to claim 17, comprising a frequency multiplier multiplying by M having an input receiving the signal at divided frequency and an output coupled to the input of the second phase/frequency comparator, where M is the ratio of the frequency of the second reference signal to the frequency of the first reference signal.

20. A radiofrequency transmitter and/or receiver according to claim 17, comprising means for temporarily deactivating the second loop on power-up and/or in case of change of a preset for the output frequency.

21. A radiofrequency transmitter and/or receiver comprising:
a frequency synthesizer including:
a phase locked loop including:
a controlled oscillator for delivering an output signal at a determined output frequency; and
a frequency divider for converting the output signal into a signal at divided frequency, including:
a first loop having a loop filter for generating a first signal for control of the oscillator on the basis of the signal at divided frequency, wherein the first loop comprises a phase/frequency comparator for producing a first signal of measurement of a phase/frequency deviation between the signal at divided frequency, on the one hand, and a first reference signal at a first determined reference frequency, on the other hand; and
a second loop having a loop filter different from the loop filter of the said first loop, for generating, on the basis of the signal at divided frequency, a second signal for additional control of the oscillator, wherein the second loop comprises a frequency detector for producing a second signal of measurement of a frequency deviation between a signal obtained by frequency multiplication on the basis of the signal at divided frequency, on the one hand, and a second reference signal at a second determined reference frequency, higher than the said first reference frequency, on the other hand, wherein the loop filter of the said first loop and the loop filter of the said second loop have different respective cutoff frequencies.

22. A radiofrequency transmitter and/or receiver according to claim 21, wherein the loop filter of the first loop is a low-pass filter whose cutoff frequency is lower than the first reference frequency, and wherein the loop filter of the second loop is a bandpass filter centered between the first reference frequency, on the one hand, and the second reference frequency, on the other hand, and which has a low cutoff frequency higher than the first reference frequency and a high cutoff frequency lower than the second reference frequency.

23. A radiofrequency transmitter and/or receiver according to claim 21, comprising a frequency multiplier multiplying by M having an input receiving the signal at divided frequency and an output coupled to the input of the frequency detector, where M is the ratio of the frequency of the second reference signal to the frequency of the first reference signal.

24. A radiofrequency transmitter and/or receiver according to claim 21, comprising means for temporarily deactivating the second loop on power-up and/or in case of change of a preset for the output frequency.

* * * * *